(12) United States Patent
Gorobets

(10) Patent No.: US 9,400,713 B2
(45) Date of Patent: Jul. 26, 2016

(54) SYSTEM AND METHOD FOR PRE-ENCODING OF DATA FOR DIRECT WRITE TO MULTI-LEVEL CELL MEMORY

(71) Applicant: SanDisk Technologies Inc., Plano, TX (US)

(72) Inventor: Sergey Anatolievich Gorobets, Edinburgh (GB)

(73) Assignee: SanDisk Technologies LLC, Plano, TX (US)

( * ) Notice: Subject to any disclaimer, the term of this patent is extended or adjusted under 35 U.S.C. 154(b) by 118 days.

(21) Appl. No.: 14/505,291

(22) Filed: Oct. 2, 2014

(65) Prior Publication Data

US 2016/0098319 A1  Apr. 7, 2016

(51) Int. Cl.
*G11C 29/00* (2006.01)
*G06F 11/10* (2006.01)
*G11C 11/56* (2006.01)
*G11C 16/10* (2006.01)
*G11C 29/52* (2006.01)

(52) U.S. Cl.
CPC ........ *G06F 11/1072* (2013.01); *G11C 11/5628* (2013.01); *G11C 16/10* (2013.01); *G11C 29/52* (2013.01)

(58) Field of Classification Search
CPC ........... G11C 16/0483; G11C 11/5628; G11C 16/10; G11C 16/26

USPC .......................................................... 714/773
See application file for complete search history.

(56) References Cited

U.S. PATENT DOCUMENTS

| 2010/0174847 | A1* | 7/2010 | Paley | G06F 12/0246 711/103 |
| 2011/0302354 | A1* | 12/2011 | Miller | G11C 11/5642 711/103 |
| 2014/0063939 | A1 | 3/2014 | Marcu et al. | |

* cited by examiner

*Primary Examiner* — David Ton
(74) *Attorney, Agent, or Firm* — Brinks Gilson & Lione

(57) ABSTRACT

A method and system for reducing data transfers between memory controller and multi-level cell (MLC) non-volatile memory during programming passes of a word line (WL) in the non-volatile memory. The system includes a controller and non-volatile memory having multiple WLs, each WL having a plurality of MLC memory cells. The controller stores received data in volatile memory until a target WL amount of data is received. The controller pre-encodes the received data into direct WL programming data for each programming pass necessary to program a target MLC WL. All direct WL programming data for all programming passes are stored in the volatile memory before programming. Different portions of direct WL programming data are transmitted from the controller to the non-volatile memory each pass. The received data may be deleted from the volatile memory before transmitting at least a portion of the direct WL programming data to the non-volatile memory.

20 Claims, 12 Drawing Sheets

| WL# | First | Foggy | Fine |
|---|---|---|---|
| 0 | 1 | 3 | 6 |
| 1 | 2 | 5 | 9 |
| 2 | 4 | 8 | 12 |
| 3 | 7 | 11 | 15 |
| 4 | 10 | 14 | 18 |
| ... | ... | ... | ... |
| 82 | 244 | 248 | 252 |
| 83 | 247 | 251 | 255 |
| 84 | 250 | 254 | 257 |
| 85 | 253 | 256 | 258 |

FIG. 8

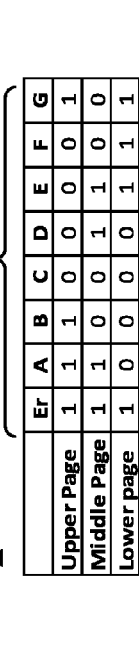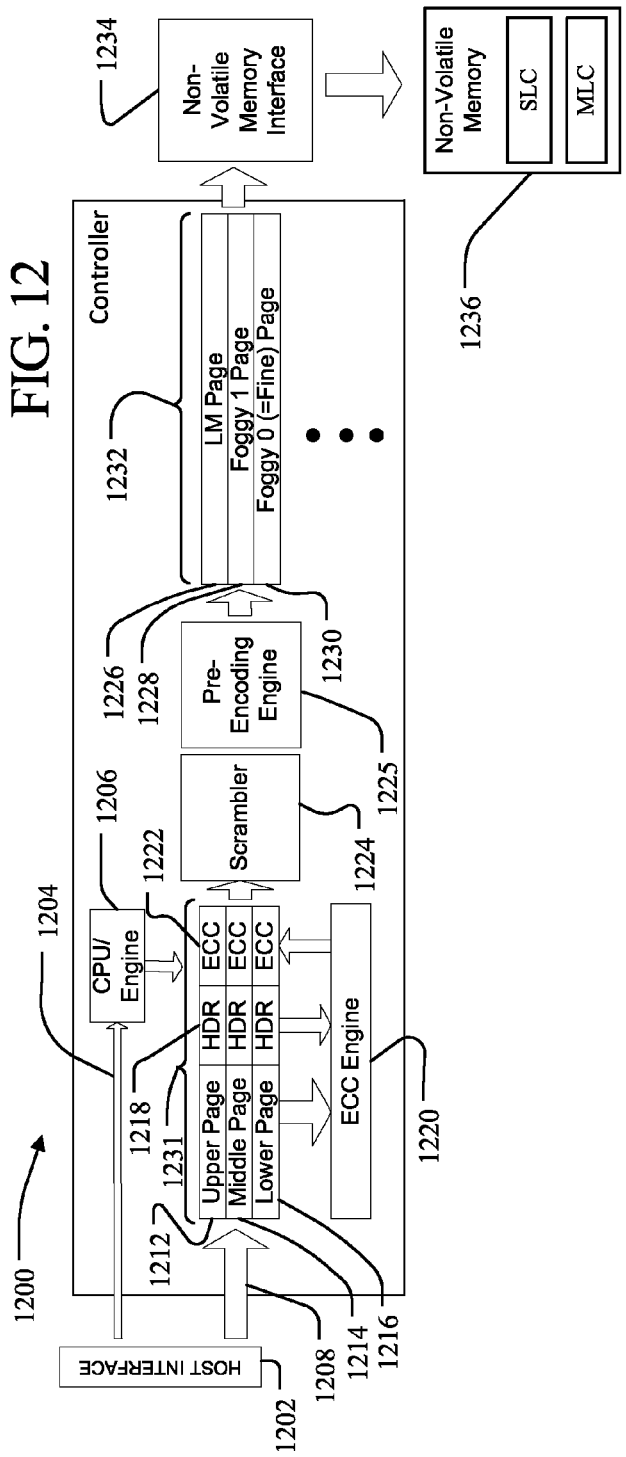

US 9,400,713 B2

SYSTEM AND METHOD FOR PRE-ENCODING OF DATA FOR DIRECT WRITE TO MULTI-LEVEL CELL MEMORY

TECHNICAL FIELD

This application relates generally to managing data in a memory system. More specifically, this application relates to a memory controller and a write process to a multi-level cell non-volatile memory.

BACKGROUND

When writing data to a non-volatile flash memory having a multi-level cell (MLC) configuration, the process is typically accomplished by storing each of the plurality of bits for a cell in random access memory (RAM) in the memory controller, for all the cells in complete world line in the flash memory, and then proceeding with a multiple stage programming process for injecting charge into each multi-bit cell to achieve the programmed state desired for that cell. As part of this multiple step flash programming process, and for each of the multiple programming steps, the RAM in the controller will typically store a copy of all the host data bits to be programmed in a cell and process the ECC and encoding of the bits to be written to the memory cell and then transfer the processed portion of the encoded bits. For example, in a three programming stage process for a three bit-per-cell MLC memory cell, three copies of the three host bits destined for each MLC memory cell may be stored in RAM in the controller and the controller may separately process and transfer three bits to the non-volatile memory for each programming stage. This would result in nine separate bits being stored in controller RAM and nine bits, three for each programming stage, being processed and sent to the flash memory over the three programming stages. By repeatedly retrieving and processing the original data for each pass of the multiple step programming process, controller resources and power is consumed, potentially reducing the overall performance of the flash memory.

BRIEF SUMMARY

In order to address the need for improved performance, methods and systems are disclosed herein for providing a controller architecture and method for reducing the amount of controller resources necessary to write to MLC flash memory cells during programming operations.

According to one aspect, a memory system includes a non-volatile memory system including a multi-level cell (MLC) non-volatile memory having a plurality word lines, each word line (WL) having a plurality of MLC memory cells and programmable in a plurality of programming passes. The memory system may include circuitry such as a volatile memory configured to receive, in a first portion, an amount of received data from a data source corresponding to a storage capacity of a WL in the MLC non-volatile memory. The circuitry may also include a pre-encoding engine configured to convert the amount of received data in the first portion into direct WL programming data for all of the plurality of programming passes to be performed in one of the plurality of word lines, and to store the direct WL programming data for all of the plurality of programming passes for the one of the plurality of wordlines in a second portion of the volatile memory. The circuitry may also include a processor configured to transmit a different portion of the direct WL programming data from the second portion to the one of the plurality of wordlines for each of the plurality of programming passes.

The memory system may pre-process the original received data a single time in order to generate the direct WL programming data for all of the plurality of programming passes for a WL. The processor may also be configured to delete the amount of received data from the volatile memory before transmitting at least a portion of the direct WL programming data to the MLC non-volatile memory from the volatile memory.

In another aspect, a method for managing data writes to a WL of a non-volatile memory is provided. The methods may include receiving data from a data source and storing the received data in a first portion of the volatile memory until a predetermined amount of data corresponding to a storage capacity of a word line (WL) in the MLC non-volatile memory is received. The predetermined amount of received data is pre-encoded into direct WL programming data for each of a plurality of programming passes to be performed in the MLC non-volatile memory for one WL. The pre-encoded direct WL programming data for all of the plurality of programming passes for the WL is stored in a second portion of the volatile memory. For each of the plurality of programming passes for the WL, the method includes transmitting from the second portion of the volatile memory an amount of direct WL programming data that is less than the predetermined amount of data received.

Other features and advantages will become apparent upon review of the following drawings, detailed description and claims. Additionally, other embodiments are disclosed, and each of the embodiments can be used alone or together in combination. The embodiments will now be described with reference to the attached drawings.

BRIEF DESCRIPTION OF THE DRAWINGS

FIG. 8 illustrates an example chart of an interleaved word line write and programming pass order for programming a three bit per cell NAND memory.

FIG. 12 is a functional block diagram of control circuitry in the memory system of FIG. 1 for implementing a multiple stage NAND flash programming operation with reduced data transfer operation such as illustrated in FIGS. 9-11.

FIG. 13 is an embodiment of a direct WL write operation bit conversion table usable in the memory system of FIGS. 1 and 12.

DETAILED DESCRIPTION

Figure 1:
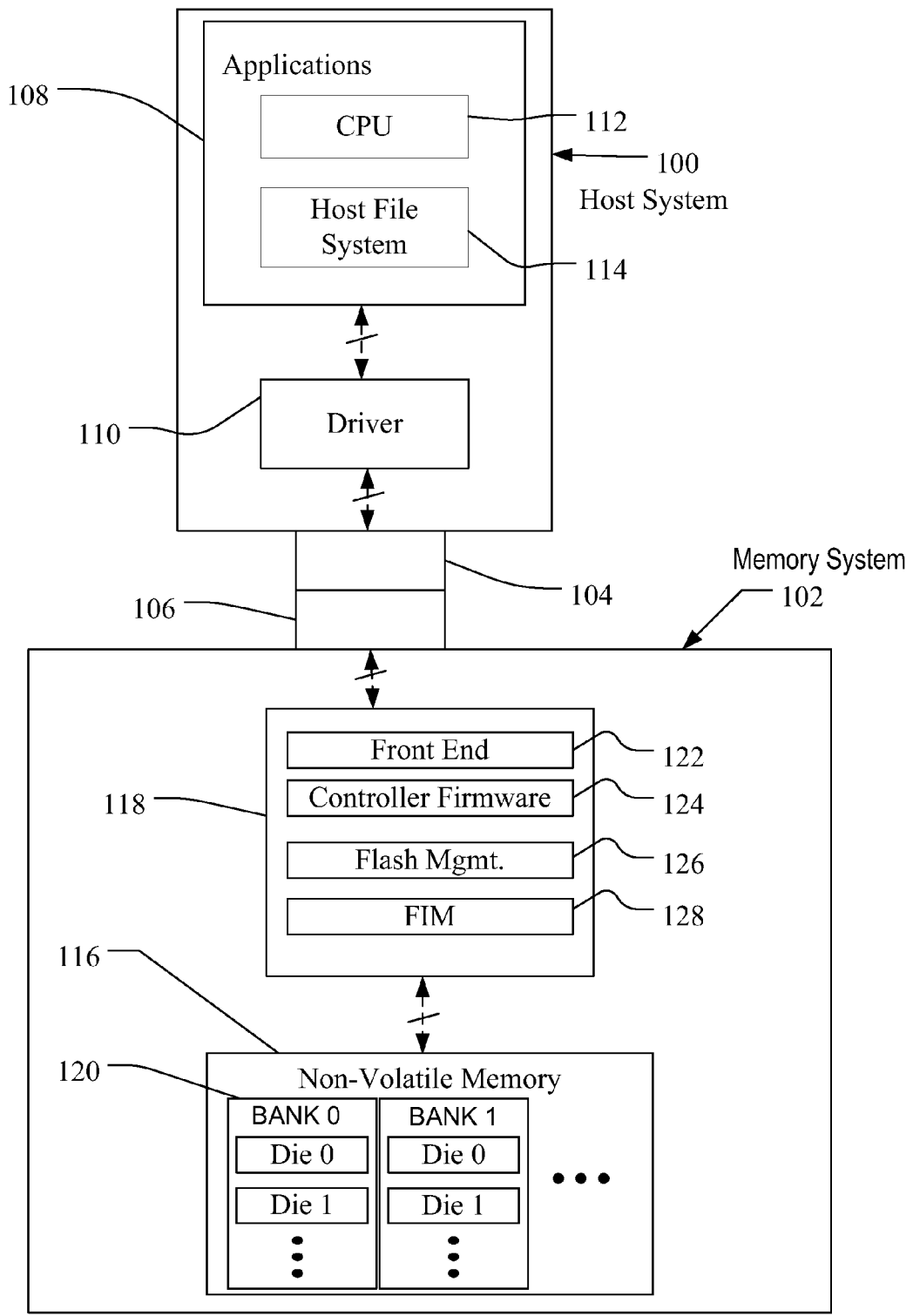
FIG. 1 illustrates a host connected with a memory system having a multi-bank non-volatile memory containing multiple die.

A flash memory system suitable for use in implementing aspects of the invention is shown in FIGS. 1-6. A host system 100 of FIG. 1 stores data into and retrieves data from a memory system 102. The memory system may be flash memory embedded within the host, such as in the form of a solid state disk (SSD) drive installed in a personal computer. Alternatively, the memory system 102 may be in the form of a card that is removably connected to the host through mating parts 104 and 106 of a mechanical and electrical connector as illustrated in FIG. 1. A flash memory configured for use as an internal or embedded SSD drive may look similar to the schematic of FIG. 1, with the primary difference being the location of the memory system 102 internal to the host. SSD drives may be in the form of discrete modules that are drop-in replacements for rotating magnetic disk drives.

The host system 100 of FIG. 1 may be viewed as having two major parts, insofar as the memory system 102 is concerned, made up of a combination of circuitry and software. They are an applications portion 108 and a driver portion 110 that interfaces with the memory system 102. In a PC, for example, the applications portion 110 can include a processor 112 running word processing, graphics, control or other popular application software, as well as the file system 114 for managing data on the host 100. In a camera, cellular telephone or other host system that is primarily dedicated to performing a single set of functions, the applications portion 108 includes the software that operates the camera to take and store pictures, the cellular telephone to make and receive calls, and the like.

The memory system 102 of FIG. 1 may include non-volatile memory, such as flash memory 116, and a system controller 118 that both interfaces with the host 100 to which the memory system 102 is connected for passing data back and forth and controls the memory 116. The system controller 118 may convert between logical addresses of data used by the host 100 and physical addresses of the flash memory 116 during data programming and reading. The flash memory 116 may include any number of memory banks 120 and two memory banks are shown in FIG. 1 simply by way of illustration. Functionally, the system controller 118 may include a front end 122 that interfaces with the host system, controller logic 124 for coordinating operation of the memory 116, flash management logic 126 for internal memory management operations such as garbage collection, and one or more flash interface modules (FIMs) 128 to provide a communication interface between the controller with the flash memory 116.

Figure 2:
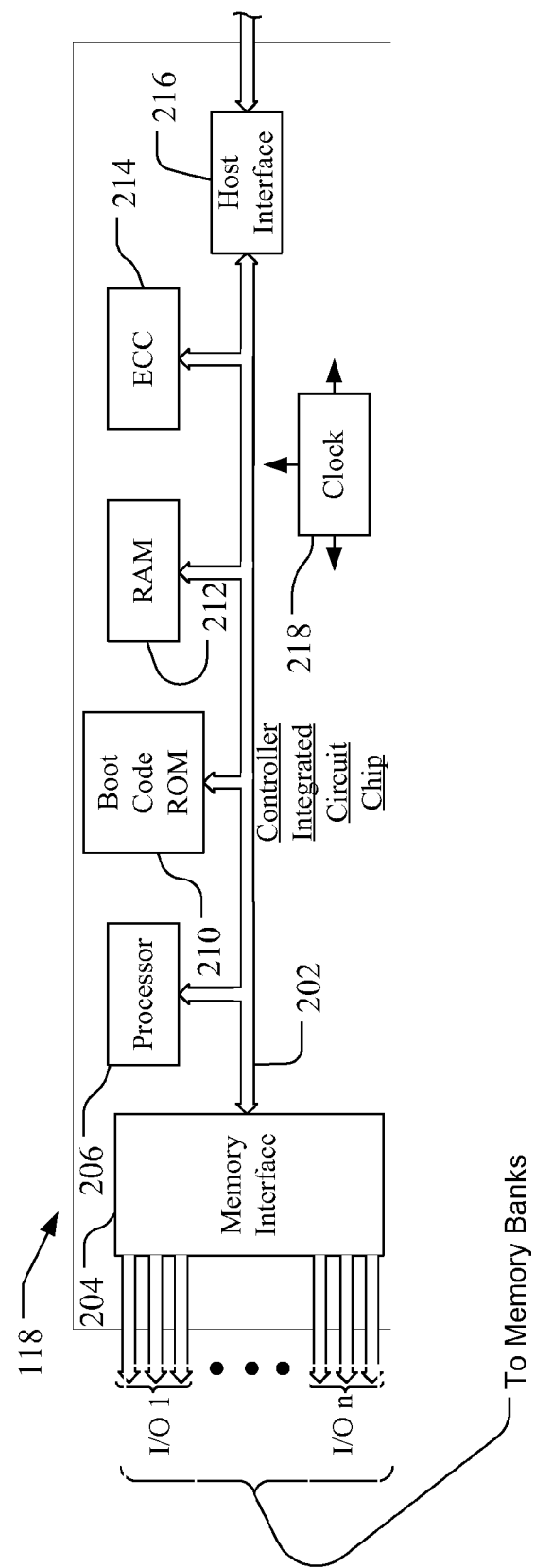
FIG. 2 is an example block diagram of an example flash memory system controller for use in the memory system of FIG. 1.

The system controller 118 and may be implemented on a single integrated circuit chip, such as an application specific integrated circuit (ASIC) such as shown in FIG. 2. The processor 206 of the system controller 118 may be configured as a multi-thread processor capable of communicating separately with each of the respective memory banks 120 via a memory interface 204 having I/O ports for each of the respective banks 120 in the flash memory 116. The system controller 118 may include an internal clock 218. The processor 206 communicates with an error correction code (ECC) module 214, a RAM buffer 212, a host interface 216, and boot code ROM 210 via an internal data bus 202.

Figure 3:
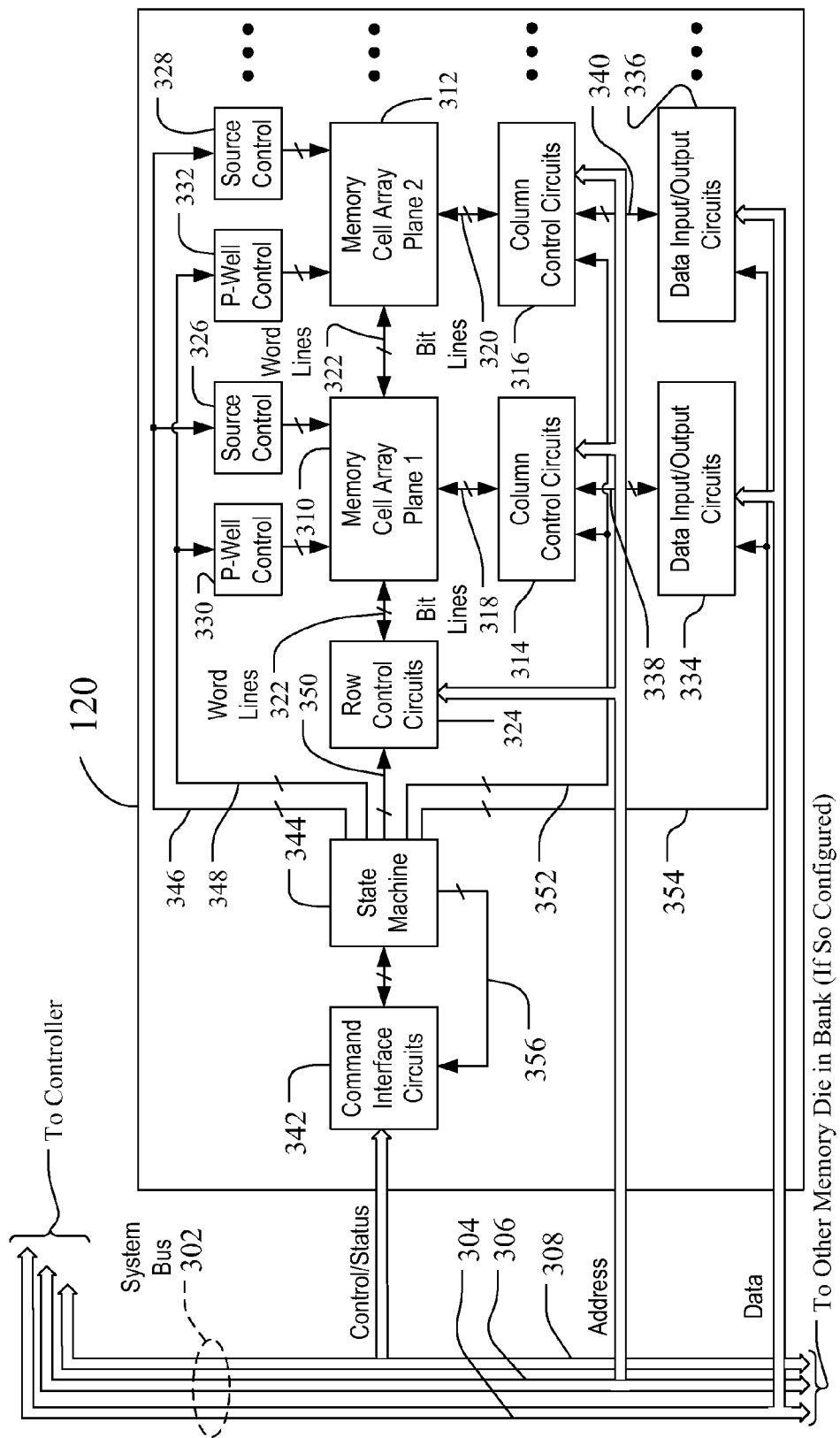
FIG. 3 is an example one flash memory bank suitable as one of the non-volatile memory banks illustrated in FIG. 1.

Each memory bank 120 in the flash memory 116 may contain one or more memory die each having an array of memory cells organized into multiple planes. FIG. 3 illustrates one embodiment of planes 310 and 312 in a die, however only a portion of the planes/arrays in the memory die are illustrated for simplicity. A greater number of planes, such as four, eight or more planes, may instead be used. Alternatively, the memory cell array of a memory bank may not be divided into planes. When so divided, however, each plane has its own column control circuits 314 and 316 that are operable independently of each other. The circuits 314 and 316 receive addresses of their respective memory cell array from the address portion 306 of the system bus 302, and decode them to address a specific one or more of respective bit lines 318 and 320. The word lines 322 are addressed through row control circuits 324 in response to addresses received on the address bus 19. Source voltage control circuits 326 and 328 are also connected with the respective planes, as are p-well voltage control circuits 330 and 332. If the bank 300 is in the form of a memory chip with a single array of memory cells, and if two or more such chips exist in the system, data are transferred into and out of the planes 310 and 312 through respective data input/output circuits 334 and 336 that are connected with the data portion 304 of the system bus 302. The circuits 334 and 336 provide for both programming data into the memory cells and for reading data from the memory cells of their respective planes, through lines 338 and 340 connected to the planes through respective column control circuits 314 and 316.

Although the processor 206 in the system controller 118 controls the operation of the memory chips in each bank 120 to program data, read data, erase and attend to various housekeeping matters, each memory chip also contains some controlling circuitry that executes commands from the controller 118 to perform such functions. Interface circuits 342 are connected to the control and status portion 308 of the system bus 302. Commands from the controller 118 are provided to a state machine 344 that then provides specific control of other circuits in order to execute these commands. Control lines 346-354 connect the state machine 344 with these other circuits as shown in FIG. 3. Status information from the state machine 344 is communicated over lines 356 to the interface 342 for transmission to the controller 118 over the bus portion 308.

A NAND architecture of the memory cell arrays 310 and 312 is discussed below, although other architectures, such as NOR, can be used instead. An example NAND array is illustrated by the circuit diagram of FIG. 4, which is a portion of the memory cell array 310 of the memory bank 300 of FIG. 3. A large number of global bit lines are provided, only four such lines 402-408 being shown in FIG. 4 for simplicity of explanation. A number of series connected memory cell strings 410-424 are connected between one of these bit lines and a reference potential. Using the memory cell string 414 as representative, a plurality of charge storage memory cells 426-432 are connected in series with select transistors 434 and 436 at either end of the string. When the select transistors of a string are rendered conductive, the string is connected between its bit line and the reference potential. One memory cell within that string is then programmed or read at a time.

Figure 4:
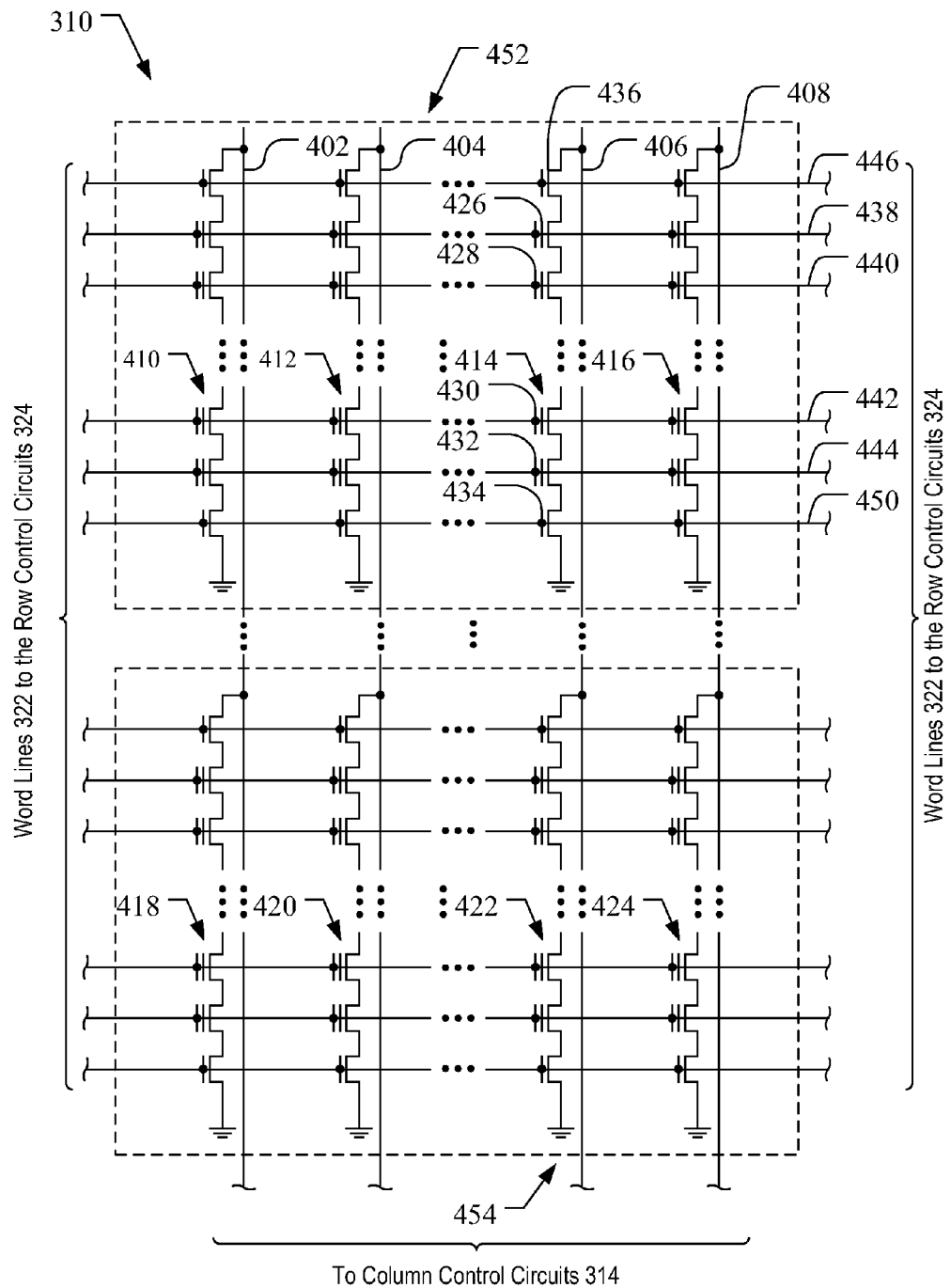
FIG. 4 is a representative circuit diagram of a memory cell array showing word lines and block groupings that may be used in the memory bank of FIG. 3.

Word lines 438-444 of FIG. 4 individually extend across the charge storage element of one memory cell in each of a number of strings of memory cells, and gates 446 and 450 control the states of the select transistors at each end of the strings. The memory cell strings that share common word and control gate lines 438-450 are made to form a block 452 of memory cells that are erased together. This block of cells contains the minimum number of cells that are physically erasable at one time. One row of memory cells, those along one of the word lines 438-444, are programmed at a time. Typically, the rows of a NAND array are programmed in a prescribed order, in this case beginning with the row along the word line 444 closest to the end of the strings connected to ground or another common potential. The row of memory cells along the word line 442 is programmed next, and so on, throughout the block 452. The row along the word line 438 is programmed last.

A second block 454 is similar, its strings of memory cells being connected to the same global bit lines as the strings in the first block 452 but having a different set of word and control gate lines. A plurality of blocks is contemplated for each array. The word and control gate lines are driven to their proper operating voltages by the row control circuits 324. If there is more than one plane in the system, such as planes 1 and 2 of FIG. 3, one memory architecture uses common word lines extending between them. There can alternatively be more than two planes that share common word lines. In other memory architectures, the word lines of individual planes are separately driven.

The memory cells may be operated to store two levels of charge so that a single bit of data is stored in each cell. This is also referred to as a X1 or single level cell (SLC) memory. Alternatively, the memory cells may be operated to store more than two detectable levels of charge in each charge storage element or region, thereby to store more than one bit of data in each. This latter configuration is referred to as multi-level cell (MLC) memory. One or both types of memory cells may be used in a memory, for example binary flash memory may be used for caching data and MLC memory may be used for longer term storage. The charge storage elements of the memory cells are most commonly conductive floating gates but may alternatively be non-conductive dielectric charge trapping material. Referring again to FIG. 1, each bank 120 may include die configured with arrays of SLC or MLC memory cells, where one bank 120 may include SLC memory cells and another bank 120 may include MLC memory cells, or each bank may have a combination of types of SLC and MLC memory cells.

Figure 5:
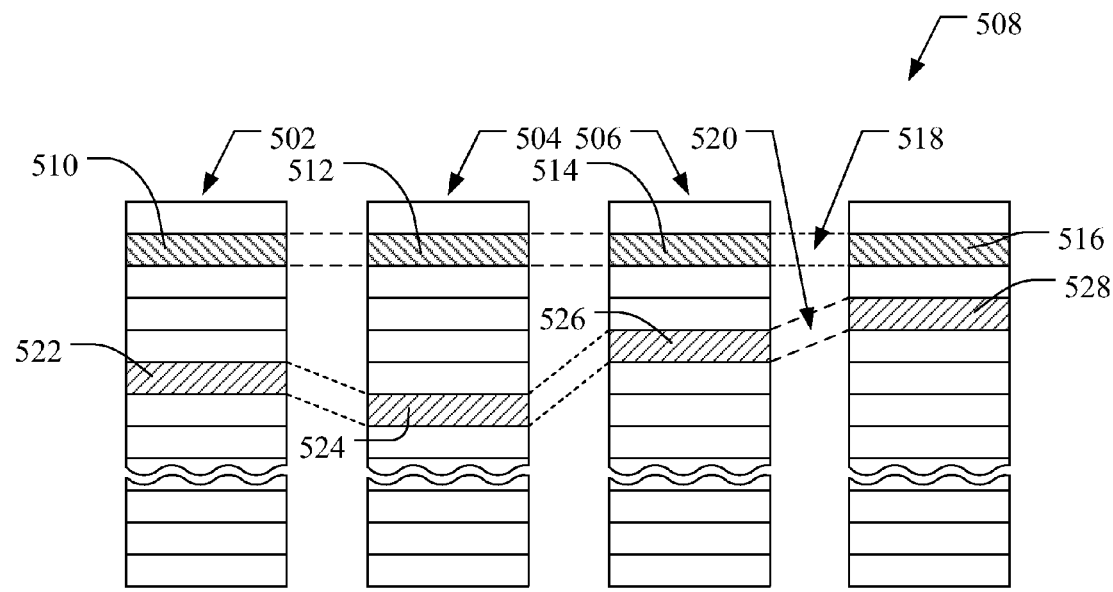
FIG. 5 illustrates an example physical memory organization of the memory bank of FIG. 3.

FIG. 5 conceptually illustrates a multiple plane arrangement showing four planes 502-508 of memory cells. These planes 502-508 may be on a single die, on two die (two of the planes on each die) or on four separate die. Of course, other numbers of planes, such as 1, 2, 8, 16 or more may exist in each die of a system. The planes are individually divided into blocks of memory cells shown in FIG. 5 by rectangles, such as blocks 510, 512, 514 and 516, located in respective planes 502-508. There can be dozens or hundreds of blocks in each plane.

As mentioned above, a block of memory cells is the unit of erase, the smallest number of memory cells that are physically erasable together. For increased parallelism, however, the blocks are operated in larger metablock units. One block from each plane is logically linked together to form a metablock. The four blocks 510-516 are shown to form one metablock 518. All of the cells within a metablock are typically erased together. The blocks used to form a metablock need not be restricted to the same relative locations within their respective planes, as is shown in a second metablock 520 made up of blocks 522-528. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 6:
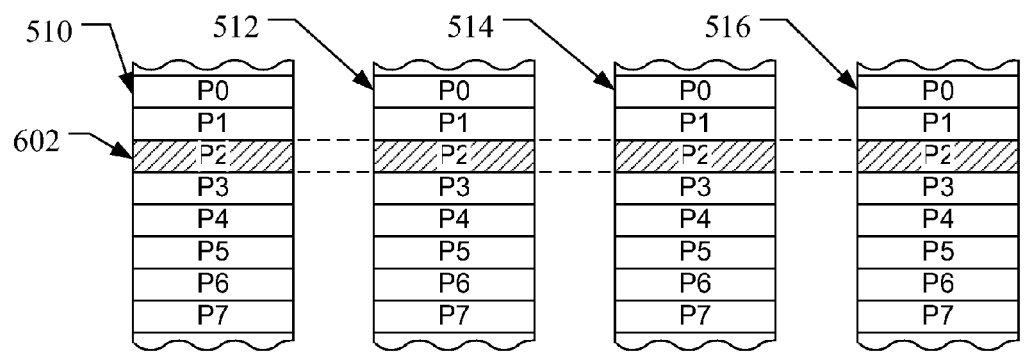
FIG. 6 shows an expanded view of a portion of the physical memory of FIG. 5.

The individual blocks are in turn divided for operational purposes into pages of memory cells, as illustrated in FIG. 6. The memory cells of each of the blocks 510-516, for example, are each divided into eight pages P0-P7. Alternatively, there may be 32, 64 or more pages of memory cells within each block. The page is the unit of data programming and reading within a block, containing the minimum amount of data that are programmed or read at one time. In the NAND architecture of FIG. 3, a page is formed of memory cells along a word line within a block. However, in order to increase the memory system operational parallelism, such pages within two or more blocks may be logically linked into metapages. A metapage 602 is illustrated in FIG. 6, being formed of one physical page from each of the four blocks 510-516. The metapage 602, for example, includes the page P2 in each of the four blocks but the pages of a metapage need not necessarily have the same relative position within each of the blocks. Within a die, a metapage is the maximum unit of programming.

Figure 7:
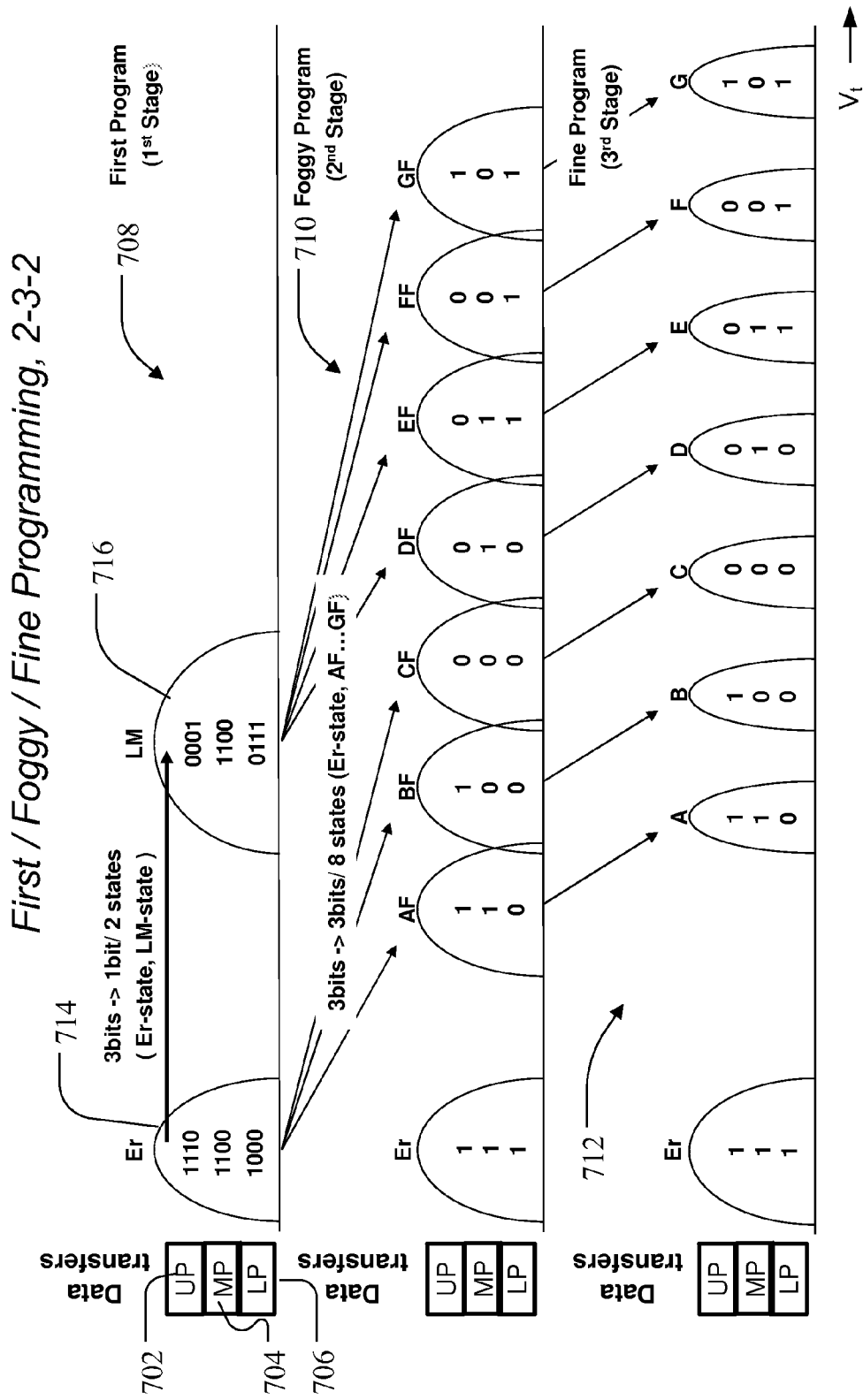
FIG. 7 illustrates an example non-volatile memory programming chart illustrating target voltage levels for each stage of a three stage NAND flash programming operation in a three bit-per-cell memory.

When programming each cell of a word line (WL), such as cell 426 of WL 438 in FIG. 4, a programming circuit in the non-volatile memory, which may include a charge pump or other internal controller circuitry generally found in non-volatile flash memory die typically injects small charges into a cell until the desired voltage state is reached. In an MLC memory cell configured to store 3 bits of information, which is also referred to herein as X3 memory, there are $2^3=8$ possible states necessary to represent the 3 bits. The 8 states (referred to herein as Er, A, B, C, D, E, F, and G, where Er refers to the erase state) are 8 discrete voltage levels ($V_t$) that the cell may be programmed to. Referring to FIG. 7, each cell in a WL for a 3 bit-per-cell NAND flash memory may store a bit from each of 3 different pages: an upper page bit (UP) 702 a middle page bit (MP) 704 and a lower page bit (LP) 706. A typical programming operation for such a memory cell would require that the 3 original bits of host data intended for that cell be transferred from the controller to the NAND memory three times, one time for each of three programming passes needed to nudge the correct amount of charge into the cell to reach the desired voltage state without overshooting the desired voltage state.

As indicated in FIG. 7, the three programming passes or states may be referred to herein as the first programming pass 708, the foggy programming pass 710 and the fine programming pass 712, respectively. Generally speaking, the first programming pass 708 will be a cruder voltage pulse that leaves the stored voltage at either an Erased (Er) 714 level or an intermediate level (LM 716 in FIG. 7) where the Er voltage level permits subsequent continued programming into one of the first 4 of the 8 desired voltage states (Er, A, B or C) and the LM voltage level pushes the voltage to a threshold that can be increased to one of the latter 4 of the 8 desired voltage states (D, E, F or G).

In a typical first/foggy/fine programming scheme in the memory such as illustrated in FIG. 7, the original 3 host bits are repeatedly sent from the controller to the NAND to perform each of the three programming stages. Thus, in the second or "foggy" programming step the UP, MP, and LP data are again sent from controller to NAND memory. The UP, MP and LP bits are used by the non-volatile memory (e.g. NAND flash) to generate the foggy programming stage voltage pulses needed to push the current state (Er or LM) achieved in the first programming step 708 to a more resolved 1 of the 8 desired states. The hypothetical voltage distribution options, along with the associated state of the 3 page bits at that voltage level, after foggy programming 710 are shown in FIG. 7. After the second round of transmitting the original 3 bits of data to NAND memory and carrying out the second, or foggy, programming stage 710, the original three bits are again retrieved from RAM in the controller and sent to the NAND to provide the last, or fine, programming steps 712 necessary to achieve the desired 1 of the 8 states. A distribution for the possible programming voltages achieved after the fine programming stage 712 are shown after in FIG. 7, where the 8 possible states are shown fully restored.

Although each WL will be written to three times, the order of the writing may be interleaved among the word lines. More specifically, because the first, foggy and fine programming passes applied to neighboring word lines may lead to program disturb issues, where charges applied to one WL may affect the charges applied to a neighboring WL, a predetermined WL programming order may be utilized. One such predetermined WL programming order is illustrated in FIG. 8, where the programming of adjacent word lines is essentially interleaved to reduce the chances of a program disturb. In FIG. 8, an example programming order table 800 is provided illustrating WL number 802 and the corresponding order of WL programming steps for each of the first 804, foggy 806 and fine 808 programming passes on the respective WL. The table 800 shows that the WL programming order essentially progresses in a diagonal pattern from lower left to upper right of the table 800.

For example, the first programming pass to WL 0 is followed by a first programming pass to WL 1 and then the foggy programming pass back on WL 0. After that, the pattern proceeds where the first program pass on WL N (starting at N=2 in this example) is followed by the foggy program pass on WL N−1 and then the fine programming pass on WL N−2 until the first programming pass on the last WL is completed, as illustrated. By the time each X3 WL has been fully programmed using the traditional first/foggy/fine programming technique, the controller has transferred to the NAND memory nine pages of data to program the three pages of data. Additionally, any ECC or scrambling has been performed multiple times: once for each of the three programming passes. In order to complete the first, foggy and fine programming steps in a more efficient manner, a method and system for pre-encoding the original host data bits in the controller is contemplated. This alternative method uses the controller 118 to take the host data to calculate the word line (WL) page data as it would be internally calculated by NAND memory itself rather than sending all pages (UP, MP, LP) of host data multiple times for the NAND memory itself to process all of the data. One such method of pre-encoding WL data to NAND is shown in the sequence of direct WL programming data pre-encoding steps in FIGS. 8-11.

Figure 9:
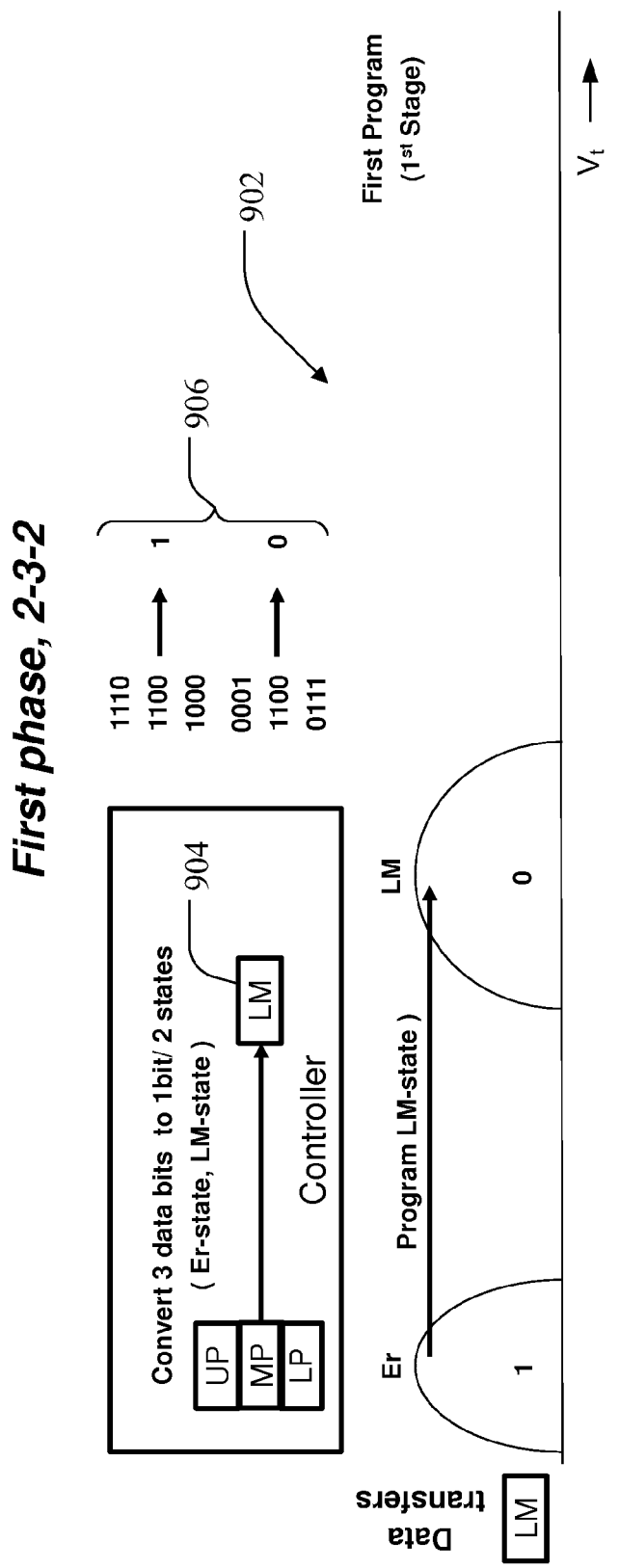
FIG. 9 illustrates a first NAND flash word line programming pass of a three stage programming operation utilizing a reduced data transfer scheme as compared to FIG. 7.

Referring now to FIG. 9, for a 3 bit-per-cell NAND memory cell, the standard 3 page bits of host data may be pre-processed by the controller into a single LM bit 904 that is later transferred to NAND memory for the first programming stage 902 as part of a single direct WL write page, rather than sending all 3 original host bits to the NAND memory as part of sending all three original pages of data to the NAND memory. Given that the first programming stage in the first, foggy, fine programming process is basically a selection between one of two voltages (Er or LM) the controller 118 may calculate or simply use a table 906 to look at the page data (UP, MP, LP) for each of the 3 bits destined for a cell in the WL to see which of two predetermined groups the 3 bits fall into. The table 906 may associate a "1" value to the first group of 4 combinations (111, 110, 100 and 000) and a "0" to the second group of 4 combinations (010, 011, 0001, 101) and, when it is time to program the destination WL using the first programming pass the controller would then pass on that single bit (LM bit 904) to the appropriate NAND memory cell during the first programming pass rather than sending all 3 original bits to program the cell for the first programming pass illustrated in FIG. 7. When the NAND memory receives the LM bit during the first programming pass 902, the charge on the target cell in the WL is moved to the Er or LM state as shown in FIG. 9.

Figure 10:
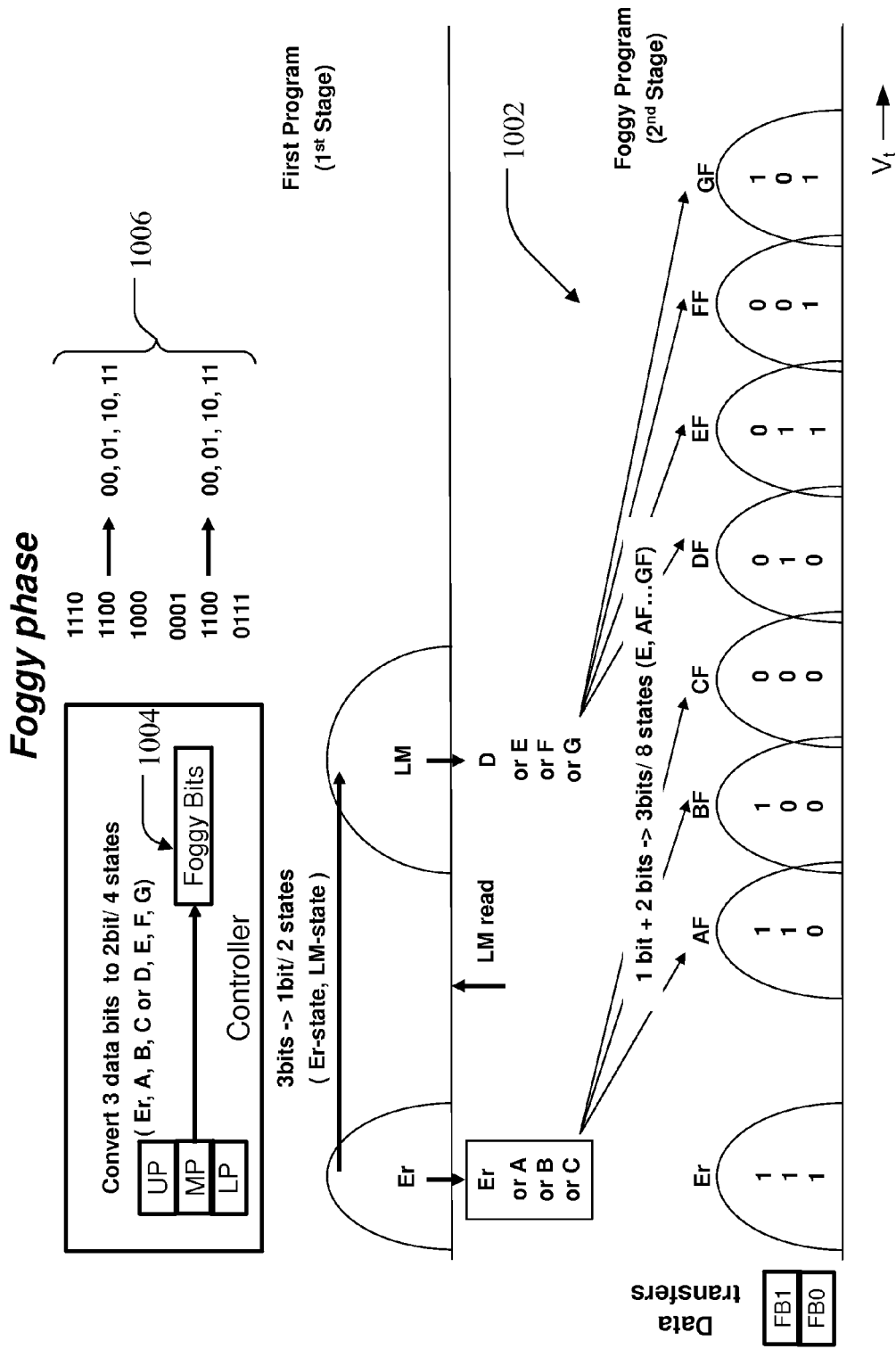
FIG. 10 illustrates a second, or foggy, NAND flash programming pass with reduced data transfer that follows the first programming pass of FIG. 9.

The pre-encoding of bits for transfer in the next, or foggy, programming pass 1002, as shown in FIG. 10, may be accomplished at the same time the controller or control circuitry is processing the original 3 bits of host data destined for the cell on the WL for the first programming pass. In this second pre-encoding step to generate data for transmission to the NAND for the foggy programming stage 1002, the controller can take advantage of the NAND memory being able to read the voltage state of the target cell after a first programming stage 902 described above to only generate two bits of pre-processed programming data to send to the NAND memory in the foggy programming pass 1002. Given that the NAND memory after the first programming step 902 will have one of two possible voltage levels (Er or LM) and can internally sense what that first stage voltage level is, then for each of those two possible voltage levels the NAND only needs 2 additional bits of information to identify which of the 4 states grouped with that original programming level is desired. So, because the Er level after the first programming stage will represent possible Er, A, B or C target levels, and the LM first programming voltage relates to possible D, E, F or G target levels, the NAND memory simply needs to know which of the four relative to the NAND readable first programming stage is desired. The controller may thus simply calculate or read from a table 1004 a two bit programming combination (foggy bits 1004) for each of the 4 states in the original two groups of bit combinations. When the foggy programming pass is executed for the WL, the controller then needs to only to send that two bit combination to the NAND memory rather than the original three host data bits as in prior programming techniques. The most significant of the two pre-processed direct WL bits for the foggy programming pass shown in FIG. 10 is foggy bit 1 (FB1) and the least significant bit of the foggy bits is foggy bit 0 (FB0).

Figure 11:
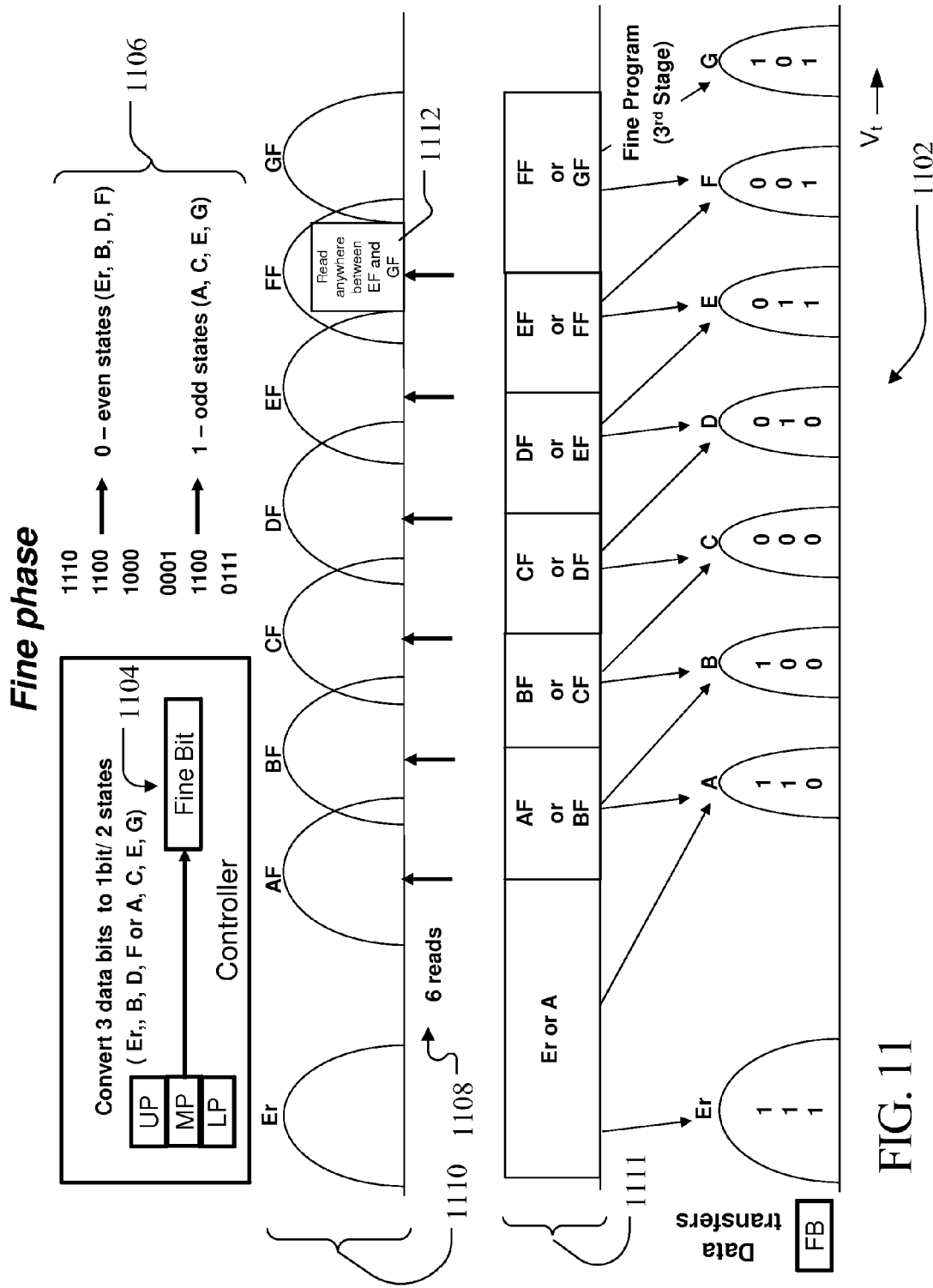
FIG. 11 illustrates a third, or fine, NAND flash programming pass with reduced data transfer that follows the first and second programming passes of FIGS. 9 and 10.

For the third and final programming stage, also referred to herein as the fine programming stage 1102 and illustrated in FIG. 11, the controller pre-processes the original 3 bits for a cell to generate a direct WL write bit for the fine programming pass. As with the pre-encoding for direct WL write bits to be used in the first and foggy programming passes, the direct WL bits for the fine programming pass are generated at the same time as the direct WL write bits and from the same original host data bits. In pre-encoding the original host bits for use in a fine programming pass 1102, the controller can reduce the original 3 bits to 1 bit.

The pre-encoding of the original 3 bits into a single direct WL programming bit for the fine programming pass is again possible because of the sensing capabilities of the NAND memory regarding the current state of the cells on the target WL. After performing a foggy programming pass 1110 on the target WL in the NAND memory, each cell on the WL will have a charge representative of one of the final 8 states (in this X3 MLC example), that just needs to be more finely tuned to reach the desired voltage level and resolution. Recognizing that the 8 possible programming states can be split into odd and even states, such as illustrated in table 1106, the pre-proceed direct WL write information for the fine programming pass 1102 may be a single bit per cell. In this example, the even states are considered the Er, B, D, F voltage states and the odd states are considered the A, C, E, G voltage states. The controller may again use a look-up table 1106 that lists the 3 bit patterns and the corresponding predetermined even or odd designation of that host data pattern.

When it is time for the fine programming pass 1102 for the WL, the controller may then simply send a single direct WL write page to the NAND memory. The NAND memory will then take the fine bit (FB 1104) for each target cell of WL and perform internal senses between non-adjacent foggy states in the target cell (see the reading points 1108 for the foggy state voltages identified in FIG. 11). The six non-adjacent states shown are between Er and BF, AF and CF, BF and DF, CF and EF, DF and FF, and EF and GF where the "F" at the end of each state simply notes it is the version of the state at the end of the foggy programming state 1110. The NAND memory may then identify the one of 7 possible foggy state 'pairs' 1111 the current (post-foggy stage) cell voltage level is located at. For convenience, each pair 1111 consists of one even and one odd state. With the single fine programming state bit FB 1004 received from the controller, the NAND may use the foggy state pair index to determine to which fine state each cell needs to be programmed. For example, if the NAND memory determines that the target cell is FF or GF (read within the box 1112 on the foggy program state diagram 1110 of FIG. 11) and the fine page bit FB 1104 received from the controller is 0 (even), the NAND memory programs the cell to the even state of the pair, or the F state. Alternatively, if the fine page bit 1104 from the controller is 1 (odd), the cell will to be programmed to odd state, which would be the G state in this example.

The pre-encoding of direct WL write bits for the direct WL write pages that are sent during the three pass first/foggy/fine programming scheme described in above may be determined in discrete processes applied to the original data bits received from the host, however in one implementation the pre-processed direct WL write information is preferably all generated at one time from the original 3 pages of host data destined for the X3 MLC WL in NAND memory. Also, sets of direct WL write pages separately calculated for multiple different WLs may be stored in an output buffer and sent to the appropriate WL in the same interleaved manner as described with respect to FIG. 8 to reduce write disturb issues.

In order to support pre-encoding host page information to the reduced programming bits used in generating direct WL write pages described above, a controller architecture and method are now discussed. Referring to FIG. 12, a functional controller architecture 1200 is shown, which may be embodied in a controller circuit such as the controller 118 of FIG. 2.

The controller 1200 may receive host data with associated host logical block address (LBA) addresses at the host interface circuit 1202 in the controller 1200. Commands and logical block address information may be routed over a first channel 1204 to the central processing unit 1206 while the data associated with the commands and logical block address information may be transmitted over a data path 1208 to upper page, middle page, or lower page (1212, 1214 and 1216) buffers in the controller 1200. The CPU 1206 may associate header information using logical block addresses accompanying the commands for writing the data and place the appropriate header information 1218 for the data with the upper page, middle page and lower page information as appropriate. Other metadata may be included in the header information 1218. When the upper page, middle page and lower page information 1212, 1214 and 1216 and associated header 1218 information are assembled, the data and header information is together sent to an error correction code (or an ECC) engine 1220 and the ECC information 1222 calculated for each of the upper page plus header, middle page plus header, and lower page plus header is appended respectively to each of the page data entries.

Following the error correction code generation for each of the pages, the data is first processed and scrambled using a scrambling engine 1224, followed by generation of direct WL write programming pages in a pre-encoding engine 1225 from the error corrected and scrambled page data. As noted above, prior to scrambling and pre-encoding the host data into the direct WL write pages, the host data with header and ECC information (the UP, MP and LP data with header and ECC, respectively) may first be passed through the error correction code (ECC) engine 1220 that implements any of a number of known ECC techniques on the data. The scrambling engine 1224 may be any of a number of types of known scrambling engines configured to break up data patterns that would otherwise result in long sequence of consecutive logical "1" or "0" states. Because a long sequence of 1's or a long sequence of 0's sometimes does not transfer well into NAND memory and may lead to imbalances in charge similar to read disturb problems sometimes seen with NAND memory, the scrambler 1224 may break up these data patterns based on a known formula to avoid these problems.

As used herein, the term "scrambling" means to subject original data to be stored in the flash memory to a randomization or scrambling process prior to storing the data in the flash memory. When reading the scrambled data, that scrambled data has to be unscrambled before use. One embodiment of that randomization process may be to randomize by XORing the data to be stored in the flash memory with a scrambler pattern. Examples of suitable scrambling mechanisms include a scrambling circuit that applies a scrambler pattern. The scrambler pattern may be a pseudorandom pattern or a pattern specifically selected to address particular program disturb affects. For example, a 32-bit data word that is unscrambled may be XORed with a 32-bit scrambler pattern in a shift register to form a 32-bit scrambled data word. Implementations may XOR one or more bits at a time. The initial value of the shift register or seed may be different for every page to reduce correlation between pages. In an exemplary embodiment, a page is 4096 bytes and a word line is 16384 bytes. Other embodiments may, have different page and word line sizes. Any of a number of available scrambling circuits and techniques may be implemented.

Once the word line amount of data (which for the 3 bit-per-cell MLC cell of this example include an upper page, middle page, and lower page data bit for each cell), header data and ECC information have been scrambled, then the pre-encoding of the scrambled and encoded bits for each page of the word line may be executed to generate the NAND direct WL programming pages. In one implementation, a pre-encoding table, such as the table 1300 shown in FIG. 13, may be stored in non-volatile memory in the controller 1200 that the processor 1206 may access to retrieve appropriate direct WL programming bits 1204 for all programming stages corresponding to appropriate one of the eight possible bit patterns 1202 of scrambled and ECC encoded bits. Alternatively, the pre-encoding engine tables may be embedded microcode in the pre-encoding engine, or completely implemented in hardware logic of the pre-encoding engine 1225. In yet other alternative implementations, the functions of the ECC engine 1220 and the scrambling engine 1224 may be combined such that the ECC engine applies both an ECC algorithm and a scrambling algorithm to the host data.

The memory system 102 may be implemented in many different ways. Each engine, such as the ECC engine 1220, the scrambler engine 1224, and the pre-encoding engine 1225, may be hardware or a combination of hardware and software. For example, each engine may include an application specific integrated circuit (ASIC), a Field Programmable Gate Array (FPGA), a circuit, a digital logic circuit, an analog circuit, a combination of discrete circuits, gates, or any other type of hardware or combination thereof. Alternatively or in addition, each module may include memory hardware, such as a portion of volatile or non-volatile memory, for example, that comprises instructions executable with the processor 1206 or other processor to implement one or more of the features of the engine. When any one of the engines includes the portion of the memory that comprises instructions executable with the processor 1206, the engine may or may not include the processor 1206. Because each engine or control circuit includes at least some hardware even when the included hardware comprises software, each engine may be interchangeably referred to as a hardware engine or module.

The table 1300 in this example contains the direct WL programming bits discussed above with respect to FIGS. 9-11, where separate direct WL programming bits for each of the programming passes (first, foggy and fine) are determined for the 3 bit pattern of scrambled and encoded bits emerging after the ECC encoding and scrambling operations for each page. Thus, after the processor 1206 in the controller 1200 executes the scrambling of the ECC encoded data, the processor looks up or determines each of the direct WL programming bits corresponding to the programming pass that the ECC encoded and scrambled data represents. For example, if the 3 bits (UP, MP, LP) of scrambled data destined for a first cell of the WL were a "110" pattern, corresponding to the "A" state in the table 1300, the controller would retrieve a LM page bit of 1, and 2 foggy page bits of 10 (foggy page 1=0, foggy page 0=1). Because the fine page bit of 1 is always the same as the foggy page 1 bit in this example, only 3 bits per cell are necessary. This is repeated for each 3 bit group of ECC encoded and scrambled cell data for the WL and the results are accumulated into separate direct WL programming pages in one a multiple volatile memory output buffers 1232, which may be controller RAM, as the LM page 1126, Foggy 1 page 1127, and Foggy 0 page 1128. This group of pre-processed data pages is also referred to herein as direct WL programming pages, where the direct WL programming pages correspond to the direct WL programming data described with respect to FIGS. 9-11. Separate output buffers 1232 for direct WL programming pages of different WLs are populated at any one time. The number of output buffers 1232 in the controller 1200 for the X3 MLC example provide above may be at least three in embodiments where the WL write interleave pattern of FIG. 8 is utilized such that different programming passes for three different WLs are being processed at any one time.

Figure 14:
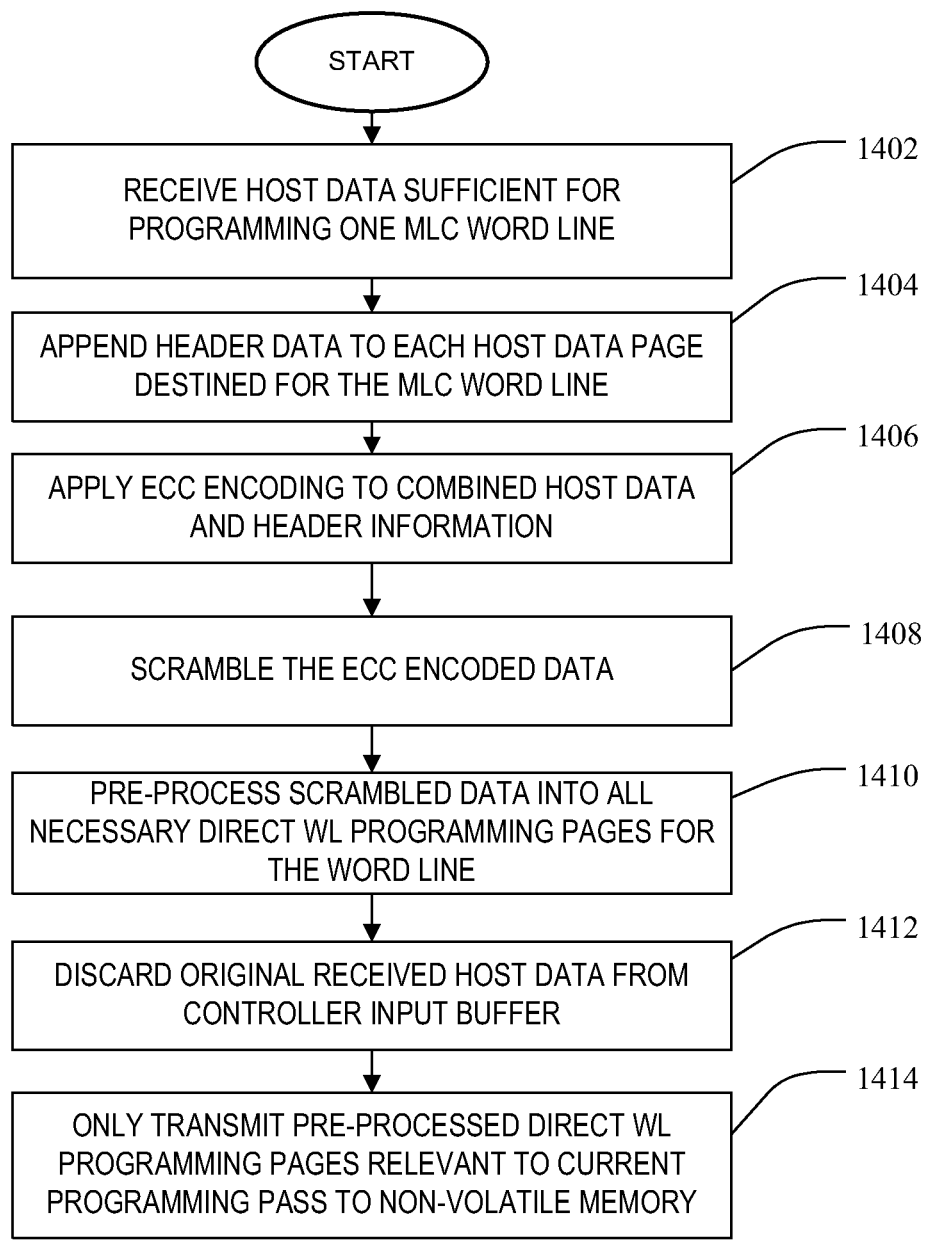
FIG. 14 is a flow diagram of an embodiment of pre-encoding received data into direct WL programming data for use in a multiple programming stage NAND flash memory programming operation and executable by the control circuitry of FIG. 12.

Referring to FIG. 14, one implementation of the pre-encoding, also referred to as pre-processing, steps from receipt of host data to transmission of the direct WL programming pages is illustrated. Assuming the 3 bit-per-cell destination WL in non-volatile memory discussed above, the host interface 1202 of the controller 1200 receives host data until an amount of data sufficient to fill three pages of data to program one WL is received (at 1402). The received data may be processed as-is or encrypted first. One bit of each of the three pages is arranged as an upper page bit, middle page bit and lower page bit, and the header information for each of the UP, MP and LP is appended to each page (at 1404).

The three pages 1212, 1214, 1216 and respective headers 1218 are passed through an error correction code engine 1220, which may be any of a number of known ECC algorithms executed by the processor 1206, to generate an ECC encoded WL of data (at 1406). The ECC encoded WL of data may then be passed through scrambling engine 1224 and direct WL programming pre-encoding engine 1225 in the controller 1200. The scrambling and pre-encoding engines may be implemented in software executed on the processor 1206 to scramble the ECC encoded WL of data with a known scrambling routine to avoid long sequences of 1's or 0's using any of a number of known scrambling algorithms as noted above (at 1408). The ECC encoded and scrambled WL of data may then be pre-processed as described above to identify, for each 3 bit cell's worth of scrambled data, the direct WL programming bits for each of the three programming phases for each of the cells in the WL. The direct WL programming bits are accumulated in the output buffer as separate direct WL programming pages (at 1410).

The resulting direct WL programming pages include a page of direct WL programming bits for the first programming phase (also referred to as the LM page), and two pages of direct WL programming bits for the foggy programming phase, which already includes a copy of the one page of fine programming phase bits. When the output buffer 1232 containing all of the pre-processed direct WL programming pages has been fully populated for the destination WL, the controller 1200 may then release the controller's input RAM buffers by discarding the original host pages to permit the controller to receive the next set of data for the next WL to be programmed (at 1412). The controller 1200 may then transfer the direct WL programming pages to the destination non-volatile memory (at 1414).

In one implementation, the controller 1200 only sends, via the non-volatile memory interface 1234, the portion of the direct WL programming pages currently needed by the non-volatile memory 1236 required for the specific programming stage (first, foggy or fine). In other words, for the first programming pass on a WL in the non-volatile memory 1236, the controller only sends the LM page 1226 of direct WL programming data and the remaining direct WL programming pages are retained in the output RAM buffer 1232 until the first programming pass is completed and a foggy programming pass for that WL is authorized, for example based on a WL write order interleave such as set out in table 800 of FIG. 8. Programming will then continue one programming step at a time, with the controller 1200 only sending out the direct WL programming page(s) for the current programming pass for the WL in the non-volatile memory.

Preferably, all of the ECC encoding, scrambling and determination of the direct WL programming bits are done from a single set of the original 3 pages of host data. In other words, the controller 1200 and method described herein only needs a single input buffer 1231 for each three pages of received host data being programmed into a respective different X3 WL and then only implements one ECC pass and a single scrambling operation to arrive at the data that will then be further pre-processed in the pre-encoding engine to obtain the direct WL programming bits for all programming stages of that WL as described above. By storing all the direct WL programming pages after a single pre-encoding pass in an output buffer 1232, an input buffer 1231 for the controller 1200 may be released earlier than in a controller system that uses multiple copies of the original data or generates the direct WL programming bits in different passes on the original data.

The controller and method described herein may require a larger output buffer 1232 so that all the direct WL programming pages for programming multiple WLs may be stored until they can be transmitted, but the controller and method reduces the processing overhead of separately and serially generating independent direct WL programming pages for each programming stage. In addition, the described method and system takes advantage of pre-encoding host data for programming passes and, for X3 MLC, only needs to send a total of 4 pages of direct WL programming data over the course of three programming passes as compared to the traditional transmission between controller and non-volatile memory of 9 pages of unprocessed host data over the course of the three first/foggy/fine programming passes. The reduction in bus congestion, power and programming time available in the disclosed method and system may improve overall memory system performance.

Also, because the four direct WL programming pages noted in FIGS. 9-11 are generated from 3 original host data pages, one page is redundant in terms of information being carried. Given that the type of direct WL programming encoding is known to the memory system, the redundant page of direct WL programming data may be identified, such as the redundancy of the foggy 0 page bit and the fine page bit. Thus, the output buffer 1232 in the controller RAM only shows three direct WL programming pages, rather than four, because the fine page data is the same as the Foggy 0 data 1230.

Once the scrambling and preprocessing is completed in the engines 1224, 1225, the LM page bits 1226, foggy page bits 1228, 1230 and fine page bits (in this example the same as foggy 0 page bits 1230) are stored in the output buffer 1232 for transmission via the non-volatile memory interface 1234 interface to the non-volatile memory 1236 memory. Again, rather than recalculating each of the first, foggy and fine programming bits from the original bits of host data separately for each programming pass, where header and ECC information is packaged and calculated three separate times, the original data is processed a single time for ECC and data scrambling needs and then all direct WL programming pages are determined at one time from that single copy of ECC processed and scrambled data. Although in the implementation discussed above, each of the direct WL programming pages pre-processed from original host data is calculated in one pass, stored on the controller and is sent one at a time, in other implementations it is contemplated that the pre-encoding process may be done in separate processing passes to separately derive direct WL programming pages for each programming pass.

The process of reading data from the non-volatile memory 1236 via the non-volatile memory interface 1234 may be a modified reversal of the direct WL write process described in FIG. 14, with the difference being that no reverse processing of the pre-encoding step 1410 would be needed for data read from the fully programmed WL. The data read from each word line in the MLC non-volatile memory may be received via the non-volatile memory interface 1234 and descrambled in the scrambler 1224 to reverse the scrambling implemented when the data was stored. Because the information read from the WL in the non-volatile MLC memory is in its final programmed form, there is no need to translate any intermediate programming stage commands such as the direct WL programming data used to program the WL. Instead, the descrambled data may then be processed to check for errors using the same ECC engine 1220 and the UP 1212, MP 1214 and LP 1216 data may be separated out from its respective ECC data 1218 and header data 1222 and stored in the input buffer 1231 in the controller 1200 for transmission to the host via the host interface 1202 or to some other destination. If, however, a host read command is directed to the data while it is still in pre-encoded and scrambled form in the output buffer (i.e. in RAM before programming into a WL in the non-volatile memory), then the host read from the RAM would require a both a reversal of the scrambling and the pre-encoding.

The example provided above in FIGS. 12-14 relates to a controller for pre-encoding data for direct word line writes to reduce the number of data transfers and processing steps over standard non-volatile memory write operations which may require multiple transmissions of bits to the non-volatile memory for the programming process. In the above example, an MLC cell capacity of three bits per cell was assumed where a WL having a plurality of MLC cells includes three pages for the word line (upper page, middle page and lower page) as described. The lookup table of FIG. 13 is based on a specific eight state pattern that results in a single LM page direct write bit, two foggy bits (foggy page one and foggy page zero) and one fine programming stage bit. In the specific example of FIG. 12, the arrangement of possible states is configured such that the fine page bit is actually the same as the foggy page zero bit for each cell in the word line. Thus, instead of needing to store on the controller four separate bits per cell for programming, only three bits per cell are necessary in that the foggy page zero bit may be used in two separate transmissions to the non-volatile memory.

In one implementation, a system and method for generating direct WL programming pages such as described above may also be configured to protect the direct WL programming pages in the case of a shutdown. When a host needs to shut down, for example a shutdown command is communicated from the host 100 to the memory system 102 when the host is going to power down, any data in a volatile memory buffer such as the output buffer 1232 may be lost. In order to prevent this from happening, an extra step of writing the direct WL programming pages directly to SLC memory in the non-volatile memory 1236 may be added prior to sending the direct WL programming data to the WL in the MLC memory. In this manner the direct WL programming pages not yet written to MLC memory can later be recovered for continuing the write process to MLC. In this embodiment, one of the four preprocessed pages for the three bit per cell example does not need to be programmed at all because it is redundant as noted above. Specifically, the redundant fine page bit and foggy page zero bit may only need one copy stored in SLC during an incomplete programming step (shut down). The fourth preprocessed page for the fine page may be reconstructed later from the stored three pages based on this known redundancy.

Intermediate storage of direct WL programming pages in SLC may also assist in circumstances where the host needs to flush the output buffers prior to completing all three programming passes for an MLC WL. The storage of pre-processed direct WL programming pages in to SLC may even be beneficial in avoiding data corruption due to unexpected shut downs, for example when a memory system is manually disconnected from the host during a write operation. If the residual capacitance in the memory system is sufficient to allow completion of a write of the direct WL programming data into SLC before the residual capacitance is used up, then the pre-processed direct WL programming data may be recoverable from the SLC in that circumstance as well.

In instances where an off-chip copy is being made from MLC to MLC (both being three bit per cell MLC) in non-volatile memory, the controller may read three stored data pages (one WL) and process them into the direct data page format discussed above for reprogramming into another portion of the MLC memory, for example to another bank or die in the non-volatile memory. During this X3 to X3 off-chip copy, when a graceful shutdown or flush cache step preventing completion of programming the data to the destination X3 occurs, the data in controller RAM need not be protected with any intermediate SLC storage if the original source X3 data locations have not yet been erased.

It is intended that the foregoing detailed description be understood as an illustration of selected forms that the invention can take and not as a definition of the invention. It is only the following claims, including all equivalents, that are intended to define the scope of this invention. Also, some of the following claims may state that a component is operative to perform a certain function or configured for a certain task. It should be noted that these are not restrictive limitations. It should also be noted that the acts recited in the claims can be performed in any order and not necessarily in the order in which they are recited.

Semiconductor memory systems, such as the ones described in the present application, may include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this invention is not limited to the two dimensional and three dimensional exemplary structures described but cover all relevant memory structures within the spirit and scope of the invention as described herein and as understood by one of skill in the art.

I claim:

1. A non-volatile memory system comprising:
    a multi-level cell (MLC) non-volatile memory having a plurality word lines, each word line (WL) having a plurality of MLC memory cells and programmable in a plurality of programming passes; and
    circuitry comprising:
        volatile memory configured to receive, in a first portion, an amount of data from a data source, the amount of received data corresponding to a storage capacity of a word line (WL) in the MLC non-volatile memory;
        a pre-encoding engine configured to convert the amount of received data in the first portion into direct WL programming data for all of the plurality of programming passes to be performed in one of the plurality of word lines, and to store the direct WL programming data for all of the plurality of programming passes for the one of the plurality of wordlines in a second portion of the volatile memory; and
        a processor configured to transmit a different portion of the direct WL programming data from the second portion to the one of the plurality of wordlines for each of the plurality of programming passes.

2. The non-volatile memory system of claim 1, wherein the circuitry further comprises an error correction code (ECC) engine in communication with the volatile memory and the pre-encoding engine, the ECC engine positioned to apply an error correction code to the amount of received data prior to the pre-encoding engine converting the amount of received data.

3. The non-volatile memory system of claim 2, further comprising:
    a data scrambling engine in communication with the ECC engine and configured to rearrange an order of data after application of an error correction code in the ECC engine and prior to the pre-encoding engine converting the amount of received data to direct WL programming data.

4. The non-volatile memory system of claim 2, wherein the pre-encoding engine comprises a data structure, and wherein the pre-encoding engine is configured to look up a set of direct WL programming bits in the data structure associated with each set of bits in the received data.

5. The non-volatile memory system of claim 1, wherein the data source comprises a host device, the first portion of the volatile memory comprises a portion of a random access memory (RAM) and the RAM is configured to receive data from the host device for programming to the MLC non-volatile memory.

6. The non-volatile memory system of claim 1, wherein the data source comprises a portion of the MLC non-volatile memory, the first portion of the volatile memory comprises a portion of a random access memory (RAM) and the RAM is configured to receive data from the portion of the MLC non-volatile memory for programming to the one of the plurality of word lines as part of an off-chip copy operation.

7. The non-volatile memory system of claim 1, further comprising a single level cell (SLC) non-volatile memory in communication with the processor, wherein the processor is configured to, in response to detecting an interruption prior to completion of the plurality of programming passes, transmit the direct WL programming data currently stored in the second portion of the volatile memory to the SLC non-volatile memory.

8. The non-volatile memory system of claim 7, wherein the interruption comprises a power shutdown.

9. The non-volatile memory system of claim 1, further comprising a single level cell (SLC) non-volatile memory in communication with the processor, wherein the controller is configured to first transmit all of the direct WL programming data stored in the second portion of the volatile memory to the SLC non-volatile memory, and to then transfer from the SLC non-volatile memory to the one of the plurality of word lines in the MLC non-volatile memory only a portion of the direct WL programming data configured for a particular programming pass of the plurality of programming passes to the MLC non-volatile memory until the particular programming pass is complete.

10. The non-volatile memory system of claim 1, wherein the MLC non-volatile memory comprises a die having a plurality of memory cells forming a monolithic three-dimensional structure.

11. A method of operating a non-volatile memory system comprising:
    in a non-volatile memory system having a multi-level cell (MLC) non-volatile memory having a plurality word lines, each word line (WL) having a plurality of MLC memory cells, and a controller in communication with the MLC non-volatile memory and a volatile memory:
        receiving data from a data source;
        storing the received data in a first portion of the volatile memory until a predetermined amount of data has been received, the predetermined amount comprising an amount of data corresponding to a storage capacity of a word line (WL) in the MLC non-volatile memory;
        converting the predetermined amount of received data into direct WL programming data for each of a plurality of programming passes to be performed in the MLC non-volatile memory for one of the plurality of word lines;
        storing the direct WL programming data for all of the plurality of programming passes for the one of the plurality of word lines in a second portion of the volatile memory; and
        for each of the plurality of programming passes for the one of the plurality of word lines, transmitting from the second portion of the volatile memory an amount of direct WL programming data that is less than the predetermined amount of data received.

12. The method of claim 11, further comprising, after storing the direct WL programming data for the plurality of programming passes, only transmitting a portion of the direct WL programming data configured for a particular programming pass of the plurality of programming passes to the MLC non-volatile memory until the particular programming pass is complete.

13. The method of claim 11, wherein the data source comprises a host device and the volatile memory comprises random access memory (RAM), and wherein receiving data comprises:
   receiving data from the host device for programming to the MLC non-volatile memory; and
   storing the received data in the RAM.

14. The method of claim 11, wherein the data source comprises a portion of the MLC non-volatile memory and receiving data comprises receiving data from the portion of the MLC non-volatile memory for programming to a different portion of the MLC non-volatile memory as part of an off-chip copy operation.

15. The method of claim 11, further comprising, in response to detecting an interruption prior to completion of the plurality of programming passes, transmitting the direct WL programming data stored in the second portion of the volatile memory to a single level cell (SLC) non-volatile memory.

16. The method of claim 15, wherein the interruption comprises a power shutdown or a volatile memory flush.

17. The method of claim 11, further comprising:
   transmitting all of the direct WL programming data stored in the second portion of the volatile memory to a single level cell (SLC) non-volatile memory; and
   transferring, from the SLC non-volatile memory to the one of the plurality of word lines in the MLC non-volatile memory, only a portion of the direct WL programming data configured for a particular programming pass of the plurality of programming passes to the MLC non-volatile memory until the particular programming pass is complete.

18. The method of claim 11, wherein converting the predetermined amount of received data into direct WL programming data further comprises the controller:
   generating error correction code data for each page of received data;
   scrambling the received data and associated error correction code data to rearrange an order of data bits in the received data and generated error correction code data into scrambled data; and
   converting the scrambled data into one or more pages of direct WL programming data for each of the plurality of programming passes.

19. The method of claim 18, wherein converting the scrambled data comprises determining a set of direct WL programming bits associated with each set of bits in the scrambled data from a data structure in the memory system containing predetermined sets of direct WL programming bits mapped to corresponding scrambled data bit patterns.

20. A non-volatile memory system comprising:
   a multi-level cell (MLC) non-volatile memory having a plurality word lines, each word line (WL) having a plurality of MLC memory cells and programmable in a plurality of programming passes; and
   circuitry comprising:
      volatile memory configured to receive, in a first portion, an amount of received data from a data source, the amount of received data corresponding to a storage capacity of a word line (WL) in the MLC non-volatile memory;
      a pre-encoding engine configured to convert the amount of received data in the first portion into direct WL programming data for all of the plurality of programming passes to be performed in one of the plurality of word lines, and to store the direct WL programming data for all of the plurality of programming passes for the one of the plurality of wordlines in a second portion of the volatile memory; and
      a processor configured to delete the amount of received data from the volatile memory before transmitting at least a portion of the direct WL programming data to the MLC non-volatile memory from the volatile memory.

* * * * *